United States Patent [19]
Graybill et al.

[11] Patent Number: 5,406,278
[45] Date of Patent: Apr. 11, 1995

[54] METHOD AND APPARATUS FOR DATA COMPRESSION HAVING AN IMPROVED MATCHING ALGORITHM WHICH UTILIZES A PARALLEL HASHING TECHNIQUE

[75] Inventors: Mark D. Graybill, Agoura Hills; Dean K. Gibson, Harbor City, both of Calif.

[73] Assignee: Intersecting Concepts, Inc., Agoura Hills, Calif.

[21] Appl. No.: 843,982

[22] Filed: Feb. 28, 1992

[51] Int. Cl.⁶ .............................................. H03M 7/30
[52] U.S. Cl. ..................................... 341/51; 341/106
[58] Field of Search ....................... 341/51, 60, 61, 86, 341/87, 89, 95, 106; 370/109; 358/426; 364/200, 239

[56] References Cited

U.S. PATENT DOCUMENTS

| | | |
|---|---|---|
| 3,914,586 | 10/1975 | McIntosh . |
| 3,976,844 | 8/1976 | Betz . |
| 4,021,782 | 5/1977 | Hoerning . |
| 4,054,951 | 10/1977 | Jackson et al. . |
| 4,087,788 | 5/1978 | Johannesson . |
| 4,295,124 | 10/1981 | Roybal . |
| 4,412,306 | 10/1983 | Moll . |
| 4,464,650 | 8/1984 | Eastman et al. . |
| 4,491,934 | 1/1985 | Heinz . |
| 4,538,240 | 8/1985 | Carter et al. . |
| 4,558,302 | 12/1985 | Welch . |
| 4,560,976 | 12/1985 | Finn . |
| 4,586,027 | 4/1986 | Tsukiyama et al. . |
| 4,588,985 | 5/1985 | Carter et al. . |
| 4,612,532 | 9/1986 | Bacon et al. . |
| 4,677,649 | 6/1987 | Kunishi et al. . |
| 4,682,150 | 7/1987 | Mathes et al. . |
| 4,701,745 | 10/1987 | Waterworth . |
| 4,730,348 | 3/1988 | MacCrisken . |
| 4,758,899 | 7/1988 | Tsukiyama . |
| 4,809,350 | 2/1989 | Shimoni et al. . |
| 4,814,746 | 3/1989 | Miller et al. . |
| 4,853,696 | 8/1989 | Mukherjee . |
| 4,872,009 | 10/1989 | Tsukiyama et al. . |
| 4,876,541 | 10/1989 | Storer . |
| 4,899,147 | 2/1990 | Schiavo et al. ................... 341/60 |
| 4,906,991 | 3/1990 | Fiala et al. . |
| 4,929,946 | 5/1990 | O'Brien et al. . |
| 4,979,039 | 12/1990 | Kisor et al. . |
| 4,988,998 | 1/1991 | O'Brien . |
| 5,003,307 | 3/1991 | Whiting et al. . |
| 5,010,553 | 4/1991 | Scheller et al. . |
| 5,016,009 | 5/1991 | Whiting et al. . |
| 5,049,881 | 9/1991 | Gibson et al. . |
| 5,132,992 | 7/1992 | Yurt et al. . |

OTHER PUBLICATIONS

Storer, J. A., *Data Compression: Methods and Theory*, Computer Science Press (1988).
Nelson, M., *The Data Compression Book*, M & T Books (1992).
Storer, J. A. and Reif, J. H. (ed.), *Data Compression Conference 1991*, IEEE Computer Society Press (1991).
Knuth, D. E., *Sorting and Searching, The Art of Computer Programming*, Chapter 6.4, vol. 3, pp. 506–542, Addison Wesley Publishing Co. (1973).

(List continued on next page.)

*Primary Examiner*—Brian K. Young
*Attorney, Agent, or Firm*—Merchant, Gould, Smith, Edell, Welter & Schmidt

[57] ABSTRACT

A method and apparatus for digital data compression having an improved matching algorithm which utilizes a parallel hashing technique. The matching algorithm of the present invention data compression method can (a) perform a first hash computation on data string subblocks of N bytes and save the hash table value; (b) perform a second hash computation on a data string subblock of N+1 bytes by using the hash result from (a) which is hashed on the data string subblocks of N bytes; (c) perform a first hash matching on data string subblocks of N+1 bytes; and (d) when the first hash matching on the data string subblock of N+1 bytes found no match, perform a second subsequent parallel hash matching on data string subblocks of N bytes.

20 Claims, 5 Drawing Sheets

OTHER PUBLICATIONS

M. E. Gonzalez-Smith and J. A. Storer, "Parallel Algorithms for Data Compression", *Journal of the Assoc. for Computing Machinery*, 32(2):344–373 (1985).

J. Cleary et al., "Data Compression Using Adaptive Coding and Partial String Matching", *IEEE Transactions on Communications*, 32:396–403 (1984).

M. Wells, "File Compression Using Variable Length Encodings", *The Computer Journal*, 15:308–313 (1972).

R. P. Brent, "A Linear Algorithm for Data Compression", *The Australian Computer Journal*, 19(2):64–67 (1987).

J. Ziv and A. Lempel, "A Universal Algorithm for Sequential Data Compression", *IEEE Transactions on Information Theory*, IT-23(3):337–343 (1977).

T. C. Bell, "Better OPM/L Text Compression", *IEEE Transactions on Communications*, CCOM-34(12):1176-1182 (1986).

D. W. Jones, "Application of Splay Trees to Data Compression", *Communications of the ACM*, 31(8):996–1007.

E. R. Fiala and D. H. Greene, "Data Compression with Finite Windows", *Communications of the ACM*, 32(4):490–505 (1989).

E. Goto et al., "Parallel Hashing Algorithms", *Information Processing Letters*, 6(1):8–13 (1977).

E. M. McCreight, "A Space-Economical Suffix Tree Construction Algorithm", *Journal of the ACM*, 23(2):262–272 (1976).

T. A. Welch, "A Technique for High Performance Data Compression", IEEE Computer, 8–19 (Jun. 1984).

M. Rodeh et al., "Linear Algorithm for Data Compression via String Matching", *Journal of the ACM*, 28(1)::16–24 (1981).

V. S. Miller and M. N. Wegman, "Variations on a Theme by Ziv and Lempel", *Conference Record–International Conference on Communications*, (IEEE Service Center, Cat. No. 88CH2538-7) 390–394 (1984).

METHOD AND APPARATUS FOR DATA COMPRESSION HAVING AN IMPROVED MATCHING ALGORITHM WHICH UTILIZES A PARALLEL HASHING TECHNIQUE

BACKGROUND OF THE INVENTION

1. Field of the Invention

The present invention generally relates to the field of data compression techniques in processing digital data signals, wherein the digital data signals are compressed and subsequently reconstituted by transforming a body of data to a typically smaller representation from which the original can be reconstructed at a later time.

Furthermore, the present invention relates to the field of data compression, wherein the digital data that is compressed and then subsequently decompressed is always kept identical to the original. More particularly, the present invention relates to the field of matching algorithms for lossless digital data compression algorithms which utilize hashing techniques to enable high compression speed and high compression ratio.

2. Description of The Prior Art

Several methods and apparatus for performing digital data compression are known in the prior art. Generally, an alphabet is a finite set containing at least one element. The elements of an alphabet are called characters. A string over an alphabet is a sequence of characters, each of which is an element of that alphabet. A common approach to compress a string of characters is textual substitution. A textual substitution data compression method is any data compression method that compresses text by identifying repeated substrings and replacing some substrings by references to other copies. Such a reference is commonly known as a pointer and the string to which the pointer refers is called a target. Therefore, in general, the input to a data compression algorithm employing textual substitution is a sequence of characters over some alphabet and the output is a sequence of characters from the alphabet interspersed with pointers.

The following prior art patents are representative known prior art data compression methods and apparatus:

1. U.S. Pat. No. 4,464,650 issued to Eastman et al. on Aug. 7, 1984 for "Apparatus And Method For Compressing Data Signals And Restoring The Compressed Data Signals" (hereafter the "Eastman patent").

2. U.S. Pat. No. 4,558,302 issued to Welch on Dec. 10, 1985 for "High Speed Data Compression And Decompression Apparatus And Method" (hereafter the "Welch patent").

3. U.S. Pat. No. 4,586,027 issued to Tsukiyama et al. on Apr. 29, 1986 for "Method And System For Data Compression And Restoration" (hereafter the "Tsukiyama '027 patent").

4. U.S. Pat. No. 4,560,976 issued to Finn on Dec. 24, 1985 for "Data Compression" (hereafter the "Finn patent").

5. U.S. Pat. No. 3,914,586 issued to Mcintosh on Oct. 21, 1975 for "Data Compression Method And Apparatus" (hereafter the "Mcintosh patent").

6. U.S. Pat. No. 4,682,150 issued to Mathes et al. on Jul. 21, 1987 for "Data Compression Method And Apparatus" (hereafter the "Mathes patent").

7. U.S. Pat. No. 4,872,009 issued to Tsukiyama et al. on Oct. 3, 1989 for "Method And Apparatus For Data Compression And Restoration" (Hereafter the "Tsukiyama '009 patent").

8. U.S. Pat. No. 4,758,899 issued to Tsukiyama on Jul. 19, 1988 for "Data Compression Control Device" (Hereafter the "Tsukiyama '899 patent").

9. U.S. Pat. No. 4,809,350 issued to Shimoni et al. on Feb. 28, 1989 for "Data Compression System" (hereafter the "Shimoni patent").

10. U.S. Pat. No. 4,087,788 issued to Johannesson on May 2, 1978 for "Data Compression System" (hereafter the "Johannesson patent").

11. U.S. Pat. No. 4,677,649 issued to Kunishi et al. on Jun. 30, 1987 for "Data Receiving Apparatus" (hereafter the "Kunishi patent").

12. U.S. Pat. No. 5,016,009 issued to Whiting et al. on May 14, 1991 for "Data Compression Apparatus and Method" (hereafter "the '009 Whiting patent").

13. U.S. Pat. No. 5,003,307 issued to Whiting et al. on Mar. 26, 1991 for "Data Compression Apparatus with Shift Register Search Means" (hereafter "the '307 Whiting patent").

14. U.S. Pat. No. 5,049,881 issued to the applicant of the current application, Mark D. Graybill, and a co-inventor Dean K. Gibson on Sep. 17, 1991 for "Apparatus and Method For Very High Data Rate-Compression Incorporating Lossless Data Compression And Expansion Utilizing A Hashing Technique" (hereafter "the '881 patent").

In general, as illustrated by the above patents, data compression systems are known in the prior art that encode a stream of digital data signals into compressed digital code signals and decode the compressed digital code signals back into the original data. Various data compression systems are known in the art which utilize special purpose compression methods designed for compressing special classes of data. The major drawback to such systems is that they only work well with the special class of data for which they were designed and are very inefficient when used with other types of data. The following compression systems are considered general purpose.

The best known and most widely used general purpose data compression procedure is the Huffman method. The Huffman method maps fixed length segments of symbols into variable length words. The Huffman method further involves calculating probabilities of the occurrences of certain symbols and establishing a tree having leaves for symbols with certain probabilities and new nodes established from lower probability symbols which nodes are also placed on the tree.

The Huffman method of data compression has many limitations. The encoding procedure of the Huffman method requires prior knowledge of the statistical characteristics of the source data. This is cumbersome and requires considerable working memory space. In addition, the Huffman method requires intensive calculations for variable bit compression. Moreover, the Huffman method requires a dictionary in the output stream for reconstruction of the digital signal or requires a prior knowledge of the dictionary which limits the applicability to specific types of data.

A second well known data compression technique is the Tunstall method, which maps variable length segments of symbols into fixed length binary words. The Tunstall method also has many of the disadvantages of the Huffman method and further has the constraint that the output string consists of fixed-length binary words.

The third well known data compression technique is the group of the Lempel-Ziv ("LZ") methods. A typical LZ method maps variable-length segments of symbols into various length binary words. A problem with the LZ methods is that the required memory space grows at a non-linear rate with respect to the input data. An improved variation of the LZ method is disclosed by and claimed in the Eastman patent. This new method taught in the Eastman patent, however, has several major disadvantages: (a) the method requires the creation of a searchtree database and therefore requires storage room for the dictionary; (b) the amount of achievable compression is heavily dependent on the dictionary; (c) management and searching of the dictionary is time consuming, yielding low data rate-compression factor product; (d) the growth characteristics of the dictionary requires $N-1$ input data string occurrences of a string of length N in order to establish a string in the dictionary. This results in reduced compression efficiency; and (e) in the worst case, the growth of output data block is tied directly to the size of the dictionary. Making the dictionary larger can improve overall compression for compressible data, but yield larger percentage growths for incompressible data because more bits are required to represent fixed length dictionary pointers. Finally, the dictionary must be reconstructed during expansion, resulting in a slower reconstitution rate and more required memory space.

The method disclosed in the Welch patent is very similar to the LZ method described in the Eastman patent and also includes all of the basic problems of the Eastman patent method. The basic difference is that instead of storing the dictionary in a tree node type structure, the Welch patent method is explicitly compressing an input stream of data character signals by storing in a string table strings of data character signals encountered in the input streams. This has the additional disadvantage of requiring more storage than the LZ method. While it does provide the advantage of being faster if the number of strings that must be searched is small it still has the poor dictionary growth characteristics of other LZ methods such as the one disclosed by the Eastman patent.

The data compression algorithms disclosed by the two Whiting patents are very similar. The '009 Whiting patent disclosed a data compression algorithm which maintains an independent "history array means" as a separate dictionary of input data. It also maintains an "offset array means" which is a supportive linking table in addition to a hash table. The '307 Whiting patent disclosed a data compression algorithm which maintains an independent "shift register" as a separate dictionary of input data. It further utilizes a broadcast channel for searching simultaneously the entries of the shift register for matching substrings. However, both Whiting patents suffer the drawback of having a "history means" which requires additional memory and processing time.

The remaining patents which discuss compression algorithms include in the process the requirement of creating a dictionary, either in the form of a tree or a series of strings or similar arrangement which requires substantial memory and storage for the dictionary or the strings and the time consuming process of searching the dictionary, yielding a low data rate-compression factor product. There is a significant need for an improved apparatus and method for compressing data which eliminates the problems discussed above and provides a faster and more efficient method of compressing the data while at the same time retaining most of the advantages of prior systems.

The data compression method disclosed in the '881 patent was invented by the applicants of the present invention, Mark Graybill and co-inventor, Dean Gibson. The '881 patent was subsequently assigned to Intersecting Concepts, Inc., a California corporation. Mark Graybill and Dean Gibson are again joint inventors of the present invention and joint applicants of the current patent application. Any patent which may be issued from the current patent application of the present invention will also be assigned to Intersecting Concepts, Inc., the same corporation. Therefore, there is no conflict of interest involved with the '881 patent and any patent issued from the current patent application.

The '881 patent discloses a method and apparatus for compressing digital data that is represented as a sequence of characters drawn from an alphabet. An input data block is processed into an output data block composed of sections of variable length. Unlike most other prior art methods which emphasize the creation of a dictionary comprised of a tree with nodes or a set of strings, the method disclosed in the '881 patent creates its own pointers from the sequence characters previously processed and emphasizes the highest priority on maximizing the data rate-compression factor product.

One of the many advantages of the '881 patent is that the compressor can process the input data block very quickly, due to the use of previously input data acting as the dictionary combined with the use of a hashing algorithm to find candidates for string matches and the absence of a traditional string matching table and associated search time. The result of the method disclosed in the '881 patent is a high data rate-compression factor product achieved due to the absence of any string storage table and matches being tested only against one string.

One essential part of any data compression method is the matching algorithm. In pursuing a data compression method with higher compression ratio and higher compression speed, the applicants of the present invention have invented a new matching algorithm which utilizes a parallel hashing technique. This new matching algorithm, when incorporated with the encoding algorithm disclosed by the '881 patent, can enhance the performance of the data compression process. Moveover, this new matching algorithm may be incorporated with any similar encoding algorithm incorporated with other data compression algorithms and enhance their performance by improving the matching algorithm.

SUMMARY OF THE INVENTION

The present invention is a method and apparatus for lossless digital data compression having an improved matching algorithm which utilizes a parallel hashing technique.

The present invention relates to a method and apparatus for compressing digital data that is represented as a sequence of characters drawn from an alphabet. As with other compression methods, the present invention processes an input data block into an output data block composed of sections of variable length. Unlike most prior art methods which emphasize the creation of a dictionary comprised of a tree with nodes or a set of strings, the present invention creates its own pointers from the sequence of characters previously processed and emphasizes the highest priority on maximizing the data rate-compression factor product.

Data compression is not only used to save data storage space, but also to increase the effective data transfer rate of a mass storage device (like a hard disk) or a modem. As modern technology improves the data transfer rates of such hardware, this places higher demands on the data rate-compression factor product of the data compression system in order to yield performance improvements. It has been discovered that when a premium is placed on maximum compression with the data rate being secondary, that the data compression system quickly becomes the limiting factor in the maximum data rate that can be achieved. Therefore, the best utilization of high-performance hardware is obtained when the data rate is given priority over the amount of compression.

It has further been discovered, according to the present invention, that the use of previously input data acting as the dictionary combined with the use of a hashing algorithm to find candidates for string matches and the absence of a traditional string matching table and associated search time allows the compressor to very quickly process the input data block. Therefore, the result is a high data rate-compression factor product achieved in part due to the absence of any string storage table. In the highest performance embodiment, each candidate for a string match is tested only against one string. However, the present invention also includes embodiments where each candidate for a string match is tested against a small number of strings.

It has additionally been discovered, according to the present invention, that the use of previously input data acting as the dictionary combined with the use of hashing algorithms to find candidates for string matches and the absence of a created dictionary eliminates the dictionary buildup slowness associated with prior art methods because the present invention method can match on a string up to the maximum count value in the identifier header upon the second occurrence of the string in the input data. As a result there is an increased probability of long string matches. In most prior art dictionary matching techniques, there is a requirement of N−1 occurrences of a string in the input data for the string of length N to be completely entered in the dictionary. By elimination of this technique, the present method results in an increased probability of long string matches.

It has further been discovered, according to the present invention, that the creation of increased probability of long string matches by matching on a string up to the maximum count value in the identifier header upon the second occurrence of the string in the input data achieves the result that a long string of repeated characters will be reduced to two output sections. The first output section will have an identification header indicating a count of one byte of incompressible data, followed by a second output section that has an identification header containing count N−1, where N is the length of the repeated character string, and pointing backwards to the first byte of the repeated character string. This results in very efficient handling and matching of repeated character strings. Therefore, through this process, the present invention eliminates the need for pre-processing with run length encoding.

It has also been discovered, according to the present invention, that the compression technique of the present invention results in a very high performance expansion of the compression data back to the original form with a lossless result. This is created because the expansion method only has to perform the following basic steps: (a) evaluate identification header for count and incompressed information; (b) compute copy pointer; (c) copy count bytes from the copy pointer to destination; (d) increment source and destination pointers appropriately; and (e) repeat steps (a) through (d) for each section.

It has further been discovered, according to the present invention, that the expansion method is unaffected by changes to the compression hashing algorithm. Since the expansion method does not perform hashing, or have to recreate a dictionary to decode the encoded data, it is insensitive to changes in the compression hashing algorithm. Thus changes to the hashing algorithm could be made according to available processing power, and appropriate compression factor gains realized, without affecting data expansion.

It has additionally been discovered, according to the present invention that the result of a high probability of long string matches means that the system does not have to examine a great deal of input data to have an efficient matching system. Smaller blocks of data can be processed at a time without significantly degrading compression performance.

Through use of the present method, it has been further discovered that good compression ratios can be achieved from small data blocks. The present method requires only two occurrences of a string to provide a match which results in high compression efficiency with small amounts of input data. Requiring only two occurrences of string to provide excellent matching combined with the limited worst case growth characteristics of the compression enables the present invention system to achieve excellent compression factor results with input data blocks as small as 50 bytes. This is substantially more efficient than the prior art methods which suffer from dictionary buildup problems which yield inefficient matching or the need to output the dictionary with the compressed data for reconstruction.

It has additionally been discovered, according to the present invention, that since the compressor copies incompressible data to the output block unchanged, except for the addition of the identifier header every maxcount bytes, the result is an extremely low worst case output block growth. For example, if 7 equals the number of bits used to represent the maxcount and 8 equals the number of bits used in the identifier header, then the worst case growth occurs when not a single repeated string of length greater than or equal to the input data subblock length can be found. Under these circumstances, the output data subblock consists of repeated sections of length $(2^7 \times 8) + 8$ bits. The additional length simply comes from the identification header being inserted every maxcount bytes. The size increase becomes one byte in every 128 bytes or less than 1% growth. In contrast, prior art patents often render higher worst case growth. For example, the worst case growth for both Whiting patents is as high as one byte in every eight bytes which is 12.5%.

It has also been discovered, according to the present invention, that the backwards offset pointers can be encoded with a variable number of bits, thereby yielding improved compression factors. Since the hashing algorithm always stores a pointer to the most recent occurrence of a string and since an encoded backwards pointer is actually expressed as a positive offset inferred in the backwards direction, the backwards distances to repeated strings can be quite small. The encoded backwards pointer offset can use a variable number of bits according to any one of a number of schemes in which smaller offsets are represented by a smaller number of bits in the output data block. Thus, the method benefits from the encoding aspects of variable bit width encoding without having the disadvantages of having to store the dictionary in the output data stream for reconstruction, and having to prescan the data during compression to gather statistics to create the dictionary. All other parameters being equal, the method will also generally outperform fixed length pointer approaches employed in many previously discussed prior art patents, such as the two Whiting patents.

It has further been discovered, according to the present invention, that a good hashing algorithm produces a high probability of finding a match, even with reasonably small hash tables. Since the hash table contains references to the most recently encountered strings, the probability of attempting to match on the wrong string (a "hash collision") is reasonably low, even with small hash tables. Since the storage requirements for the compressor arise solely from the use of the hash table, the smaller hash table sizes require smaller work random access memory storage. Therefore, with the present invention hash tables of 4 kilobytes or less in size yield very impressive compression factors.

Therefore, it is a principal object of the present invention to achieve very significant compression factors in a minimal amount of time.

It is a further object of the present invention to create a maximal rate of compression method for compressing data which will be widely useful in many applications and with many systems. Accordingly, it is an object of the present invention to include the following characteristics:

(a) The data input can be any random data and there is no assumption of a priori knowledge of input data content. For example, some specialized compression systems rely on preloading string tables with likely matches to maximize compression efficiency. A major problem with this approach is that these systems fail when the underlying assumption regarding the input data proves incorrect. The present invention does not preload any information but works with any random set of information as provided.

(b) The present method provides lossless data compression. Therefore, data that is compressed and then subsequently decompressed must always be identical to the original.

(c) The present method has a high "data rate-compression factor" product. That is, the rate at which both the compression and expansion methods process data multiplied by the compression factor (i.e. 1.5 to 1, 2 to 1, etc.) should yield a high number. This is a significant departure from prior art methods and apparatus which place a priority on achieving the highest compression factor with data rate being a secondary consideration.

(d) The present method has low memory overhead requirements and the compression factor is not very sensitive to changes in the size of the memory workspace. This allows the present method to be implemented in a wide variety of applications without significantly affecting performance.

(e) The present method does not have significant memory overhead requirement growth when the size of the input data block grows.

It is also known that the two essential algorithms of a data compression process is the matching algorithm and the encoding algorithm. A good matching algorithm can provide a solid basis for a very high data rate-compression factor. It is therefore an object of the present invention to provide an improved matching algorithm, which utilizes parallel hashing technique, for lossless very high data-rate compression.

It has also been discovered, according to the present invention, that if the matching algorithm can perform two parallel hash matchings with different sized data string subblocks, then the chances of finding a matching string can be significantly increased.

It has further been discovered, according to the present invention, that if the matching algorithm can (a) perform a first hash computation on data string subblocks of N bytes and save the hash table value, (b) perform a second hash computation on data string subblock of N bytes by using the hash result from (a) which is hashed on the data string subblocks of N bytes, (c) perform a first hash matching on data string subblocks of N+1 bytes, and (d) when the first hash matching on data string subblocks of N+1 bytes found no match, perform a second subsequent parallel hash matching on data string subblocks of N bytes, then the speed of the match searching process is significantly increased, which in turn increases the data compression speed of the overall compression process.

It has additionally been discovered, according to the present invention, that the improved results can be achieved without increasing the memory storage requirement when compared to the '881 patent. For example, the two hash tables can be obtained without increasing the memory requirement by assigning the size used for each hash table to be one half of the size used for an original single hash design.

It is therefore a further object of the present invention to provide a method and apparatus for lossless digital data compression having an improved matching algorithm which utilizes a parallel hashing technique, where the matching algorithm can perform two parallel hash matchings with different sized data string subblocks, so that the chances of finding a matching string can be significantly increased. With improved chances of finding a matching data string, it is probable that less iterations of the "hash loop" are run for any particular block of data. It has been observed that in many instances the present invention improved matching algorithm with parallel hashing technique yields higher performance as well as improved compression ratio over the applicant's previous '881 patent.

It is also an object of the present invention to provide a method and apparatus for lossless digital data compression having an improved matching algorithm which utilizes a parallel hashing technique, where the matching algorithm can (a) perform a hash computation on data string subblocks of N bytes and save the hash table value, (b) perform a hash computation on data string subblock of N bytes by using the hash result from (a) which is hashed on the data string subblocks of N bytes, (c) perform a hash matching on data string subblocks of N+1 bytes, and (d) perform a second subsequent parallel hash matching on data string subblocks of N bytes when the first hash matching on data string subblocks of N+1 bytes found no match, so that the speed of the match searching process is significantly increased, which in turn increases the data compression speed of the overall compression process.

It is a further object of the present invention to provide a method and apparatus for lossless digital data compression having an improved matching algorithm which achieves the improved results without increasing the memory storage requirement when compared to the '881 patent.

An important unique feature of the present invention parallel hashing technique is that while there are two independent hash tables maintained, one which is hash matching on data string subblocks of N bytes and the other which is hash matching on data string subblocks of N+1 bytes, the hash computation on the data string subblocks of N+1 bytes is performed using the result of the hash computation on the data string subblocks of N bytes. Normally, the additional computation of any additional independent hash table would cause serious degradation on performance, as found in some prior art references which use multiple independent hash tables. The present invention overcomes this drawback by using the following relationship:

$$Hash\_N = f(byte\_1, byte\_2, \ldots byte\_N)$$

$$Hash\_N+1 = f(Hash\_N, byte\_N+1)$$

instead of $$Hash\_N+1 = f(byte\_1, byte\_2, \ldots byte\_N, byte\_N+1)$$

where the previous hash table entry for Hash_N is used for matching purpose only if the matching for Hash_N+1 fails to meet minimum matching count. Therefore, although two hash tables have been maintained, only if a match hashing failure on Hash_N+1 occurs then the possibility of a hash matching on Hash_N is examined.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DESCRIPTION OF THE PREFERRED EMBODIMENT

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Figure 1:
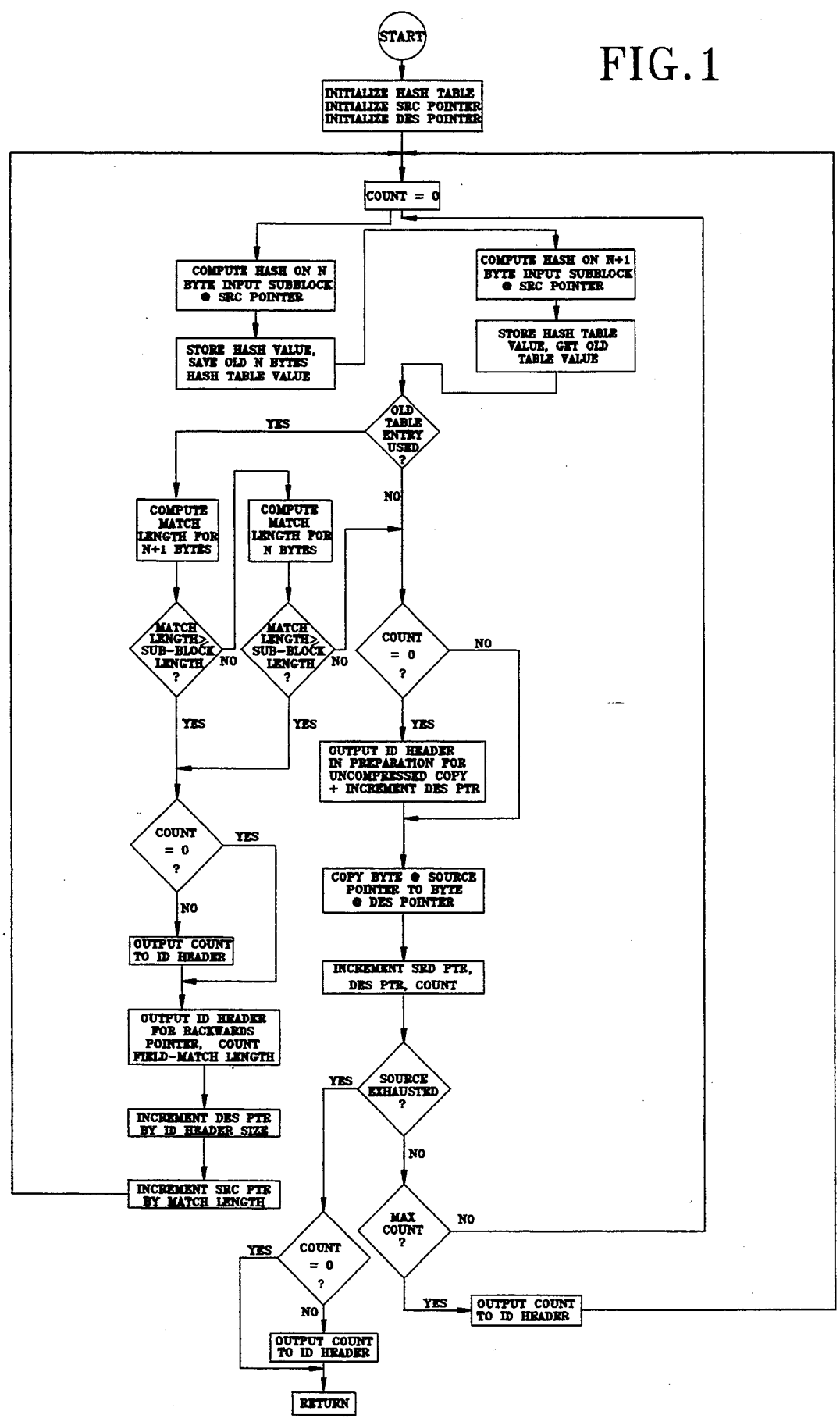
FIG. 1 is a flow chart of the present invention data compression method having an improved matching algorithm which utilizes a parallel hashing technique.

Referring to FIG. 1, there is shown the flow chart of the present invention data compression method having an improved matching algorithm which utilizes a parallel hashing technique. At the beginning it is necessary to initialize or to set to a starting position or value four key elements. The process of "hashing" refers to a storage mechanism where data items are stored at locations that are determined by a mathematical function of the data. The use of hashing makes it possible to store and retrieve data items quickly, since it is not necessary to search through a list in order to find them. The first step is to initialize the "hash tables". A hash table is a table of data entries saved or stored for future hashing. Normally the hash table contains references to previously encountered strings. Since at the beginning there are no previous strings, each hash table entry is initialized with a special value to indicate that the entry in the hash table has not been previously used.

A "pointer" is a data item consisting of an address that tells where to find another data item. The "source (SRC) pointer" points to incompressed data during the compression stage. The "destination (DES) pointer" points to where you want the compressed data to be placed during the compression stage. The SRC pointer points to raw data. The DES pointer points to compressed data. These roles are reversed during the expansion stage. A "back pointer (BP)" is data in the compressed data stream. The back pointer is a backwards offset to a previous occurrence of an identical string. The next three steps are to initialize the SRC pointer, the DES pointer, and an incompressed count value.

A fundamental novelty of the present invention data compression method is in its matching algorithm which utilizes a parallel hashing technique. The matching algorithm of the present invention data compression method performs the following steps: (a) hashing on data string subblocks of N bytes and saving the first hash table value; (b) hashing on data string subblocks of N+1 bytes and saving the second hash table value, where the second hashing is calculated on the result of the first hashing; (c) performing a first hash matching on data string subblocks of N+1 bytes, and (d) if the first hash matching on data string subblocks of N+1 bytes found no match, then perform a subsequent second parallel hash matching on data string subblocks of N bytes.

In the following examples, hash matching on 3 bytes and 4 bytes are described. It will be appreciated that N is not limited to be 3 and may vary depending on the design of the encoding algorithm. Therefore, N may be any other appropriate integer number.

After the initializing step, a minimum number of consecutive characters, for example 3 characters, is chosen so that the compressed data cannot be larger than the incompressed data. This matching occurs for every subblock of three characters, without regard to any natural boundaries in the data (e.g., English words in the case of ASCII text). For each consecutive SRC pointer value, the three character subblock pointed to is hashed to an entry in the hash table. The previous contents of that entry are used as the location of a possible match, and the current SRC pointer value replaces that entry in the hash table.

The compressor then searches for redundant string information in the input data block by performing two parallel hash calculations on input data subblocks of two different sizes. The minimum number of characters to match (and thus the size of the input data subblocks to hash) is chosen so that the compressed data cannot be larger than the incompressed data, assuming worst case output encoding conditions. In the worst case, the output stream includes back pointers and identifier headers that are equal to the size of the input data subblocks they represent. In one of the preferred embodiments of the present invention, the minimum number of characters to match is chosen to be 4 and 3 for the first and second parallel hash matching calculations, respectively. It will be appreciated that 4 and 3 are merely examples of N+1 and N used here.

Therefore, referring to the flow chart in FIG. 1, the N byte input data subblock is first hashed, and a previous location for a possible match string is obtained from and saved to this first hash table. Next, the N+1 byte input data subblock is hashed by using the N+1 byte and the current N byte hash value, and saved to a second hash table. Both hash computations are performed unconditionally and the current SRC pointer is stored in both hash tables unconditionally. If the hash table value for the N+1 hash initiates a valid previous SRC pointer, then a matching computation is performed. If the minimum match length is not achieved, then a subsequent matching using a valid N hash SRC pointer is performed. Finally, if neither hash matching comparison results in a minimum match, then the SRC pointer is incremented, and the process repeated. In any case, the hash tables are updated with the SRC pointer to the current input subblock. Updating the hash tables is unconditional—it is not dependent on whether or not a match has occurred.

The present invention method may be better understood as described in detail in one of its preferred embodiment, which includes the following steps:

(a) computing the address of the first hash table on input data subblock of N bytes [Hash_N=f(byte_1, byte_2, . . . byte_N)];

(b) exchange the current SRC pointer and hash table entry at hash table address computed in step (a), save that particular hash table entry for possible use in later matching set forth in step (e);

(c) computing the address of the second hash table on input data subblock of N+1 bytes [Hash_N+1=f-(Hash_N, byte_N+1)]

(d) exchange the current SRC pointer and hash table entry at hash HashN+1 table address computed in step (c);

(e) determine match count for hash table entry obtained in step (d). If match count is less than minimum count, then determine match count for hash table entry obtained in step (b); and (f) repeat the steps (a) through (e) until a match count is met.

This improved matching algorithm utilizing a parallel various sizes hashing technique produces an improved matching result: (a) the chances of finding a matching string is increased; (b) the data compression speed of the overall compression process may also increase; and (c) the two most important factors, namely the speed and the data compression ratio of the compression process, is well balanced.

In the encoding algorithm, each section of the output data block is preceded by an "identifier (ID) header" identifying whether (a) raw input data (i.e. incompressible date) follows a count field which follows the identifier header, or whether (b) a token containing a backwards offset from the current position (i.e. a relative pointer to previous input data and copy follows the ID header.

The compressor continues hash computations, incrementing the input data pointer and incompressed byte count value, and storing the current input data pointer in the computed hash table location for future comparison. No output data is generated until either: (a) the incompressed byte count value reaches the maximum count that the identifier header can support, or (b) a hash hit occurs, signaling the potential for a backwards pointer to be generated in the output data block as a result of comparing current input data to previous input data that is pointed to by the hash table entry, or (c) the input data block has been completely processed.

If the uncompressed byte count value reaches the maximum count that the identifier header can support, the output data block is sent an identifier header identifying the maximum count, and information indicating that incompressible data follows. The data can be copied at two alternate times: (1) the incompressible data is copied only after a hash match, which provides improved performance or (b) the incompressible data is copied after each hash calculation.

If a hash hit occurs, a maximum length string match value is obtained by comparing the string at the current input data position and the previous matching input data position pointed to by the hash table value. If the computed match length is greater than or equal to the input data subblock length, an identifier header with appropriate backwards pointer information is encoded in the output block after encoding any incompressible data which was found between occurrences of a hash hit. If the computed match length is less than the input data subblock length (indicating a hash collision), the compressor proceeds as if no hash match had occurred. This encoding approach greatly reduces the worst case growth of the output data block when incompressible data appears in the input data block.

If the input data block has been completely processed and the count value is non-zero, an incompressible identification header is sent to the output data block along with the incompressible data before the method signals processing completion of the input data block.

Figure 2:
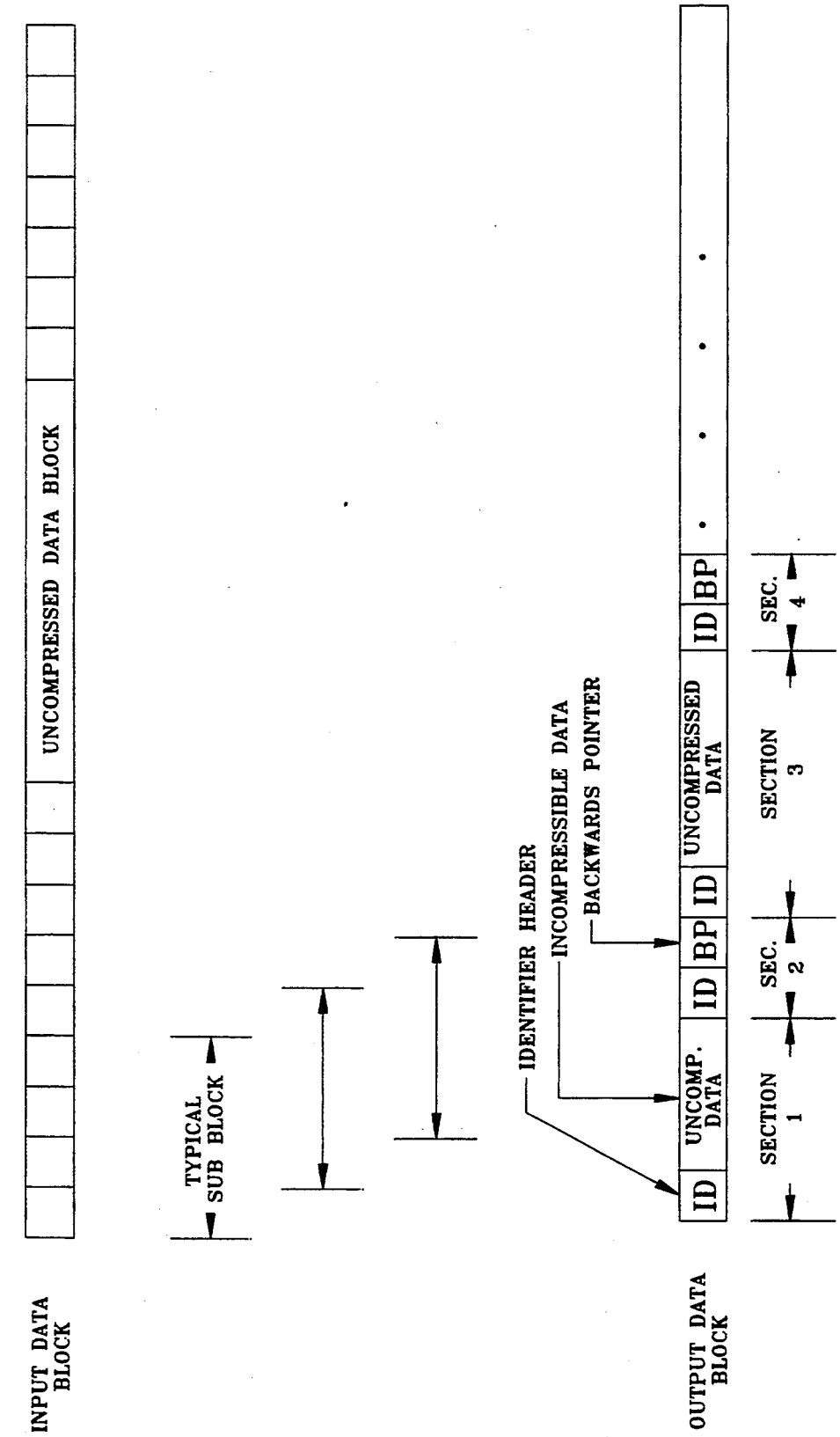
FIG. 2 is a block diagram of the general encoding strategy of the present invention data compression method.

Referring to FIG. 2, there is shown an illustration of the general format of the compressed output data. The compressed output data consists of variable length segments; each segment is either: (a) an identification header signifying incompressible data, followed by a count and the incompressible data; or (b) an identification header signifying compressed data, followed by a count and a back pointer. This format is also illustrated by the examples in FIGS. 3 and 4.

Figure 3:
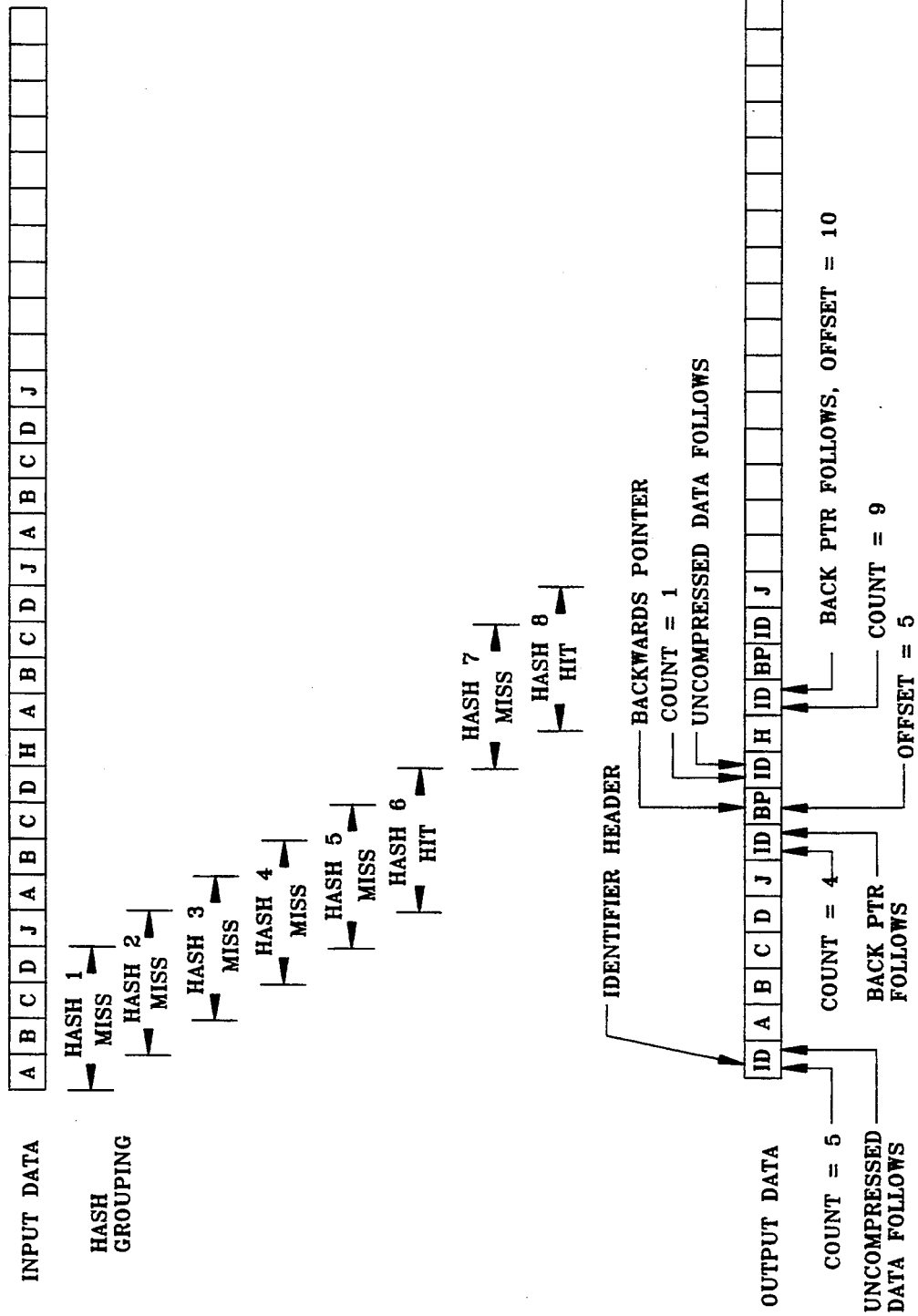
FIG. 3 is a block diagram of the data compression example of ASCII text, utilizing the present invention data compression method having an improved matching algorithm, demonstrating the process of a hash matching on 4-byte subblock of data strings.

Referring to FIG. 3, there is shown the hashing of 4 byte ASCII text subblocks. The abbreviation "ASCII"

stands for American Standard Code for Information Interchange. ASCII is a standard code for representing characters as binary numbers, used on most microcomputers, computer terminals, and printers. In addition to printable characters, ASCII includes control characters. The subblock sizes used for hashing in this example comprises 4 bytes. A "byte" is the amount of memory space needed to store one character, which is normally 8 bits (One kilobytes equals 1,024 bytes). A "bit" is shorthand term for binary digit. There are only two possible binary digits, 0 and 1. A computer with 8-bit bytes can distinguish 256 different characters. The ID header comprises 1 byte. The back pointer comprises 1, or 2 bytes as needed.

In the example shown in FIG. 3,, the input data block comprises the following input characters "ABCDJABCDHABCDJABCDJ". Beginning with the first character "A", the computer reads each group of 4 consecutive characters. The first time "ABCD" appears, it is new and therefore incompressible data. Similarly, the first time for "BCDJ", "CDJA", "DJAB", and "JABC" results in incompressible data. The second time the four characters "ABCD" is encountered, there is a hash hit because of the comparison with the first series "ABCD". Therefore, after the first identifier header, the five characters "ABCDJ" appears as incompressible data. Beginning with the next 4 count, after the next identifier header, a backwards pointer is encoded to compress the second appearance of the series "ABCD" and processing continues with the subblock "HABC".

Continuing in order of subblocks of 4 characters, the computer comes across "HABC" which is new. When the computer comes across the next series of "ABCD", it is once again a hash hit and a backwards pointer is created. The resulting match is on the string "ABCDJABCDJ"; for a match length of 9. However, the "H" separated hash hits and therefore an identifier header having a count of 1 for the "H" is encoded and the next identifier header is encoded with a count of 9 and a back pointer of 10. Finally, the last "J" is encoded with an identifier header with a count of 1.

Figure 4:
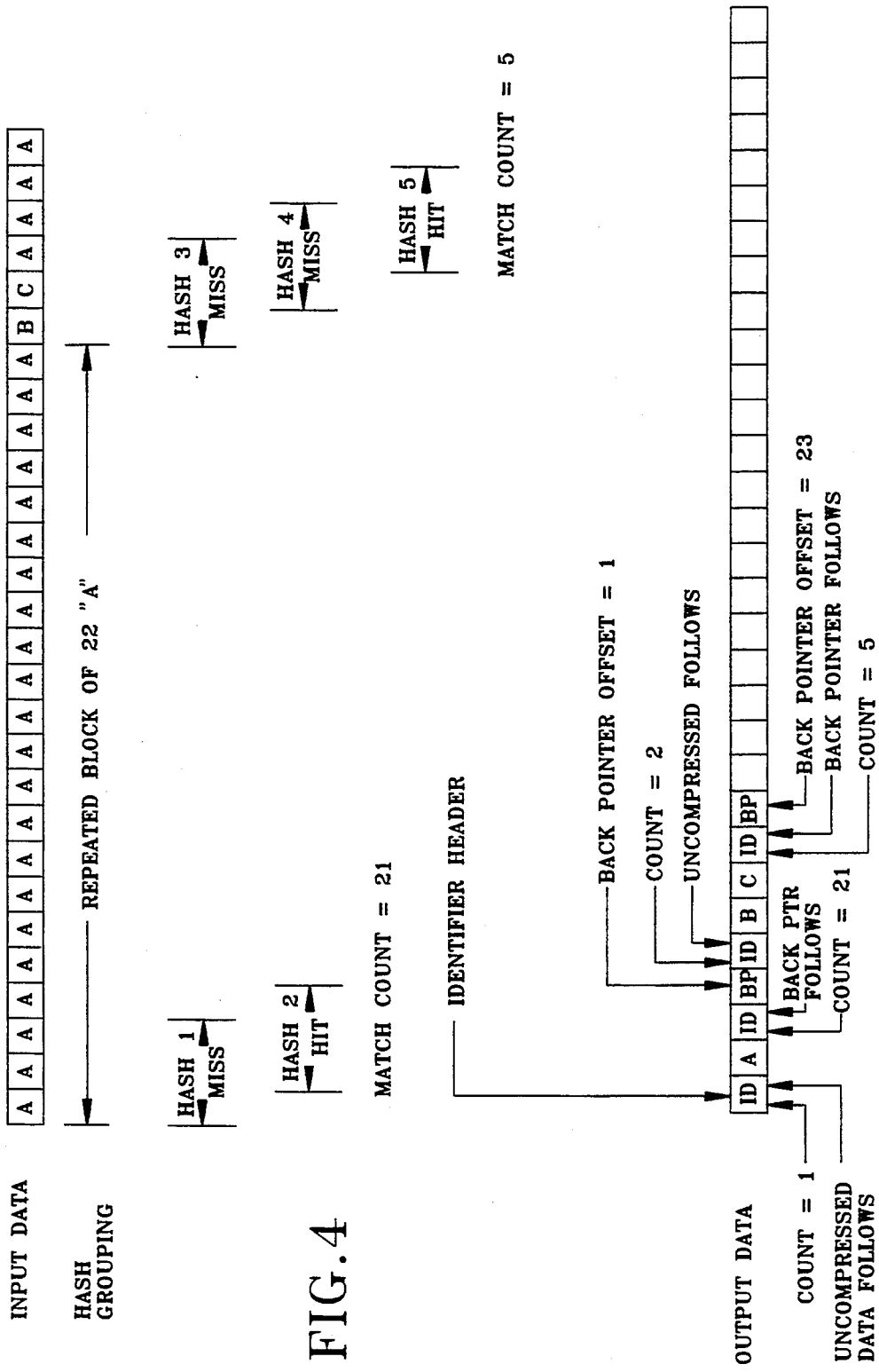
FIG. 4 is a block diagram of the data compression example of repeated characters, utilizing the present invention data compression method having an improved matching algorithm, demonstrating the process of a hash matching on 3-byte subblock of data strings.

Referring to FIG. 4, there is shown the hashing of 3 byte subblocks and an encoding example for repeated characters. Now the subblock size is 3 bytes, the identifier header is 1 byte and the back pointer is 1 or 2 bytes as needed. There are 22 "A"s in a row followed by a "B", a "C" and then 5 "A"s in a row. The first hash computation on "AAA" is new and is therefore incompressible data. The second hash computation is also on "AAA", but one byte further in the source data block. This generates a hash hit with a match count of 21.

The output is encoded with an identifier header having a count of 1 and the "A". After that, the "A" is repeated 21 more consecutive times. Therefore, a second identifier header having a count of 21 is encoded with a backwards pointer for the "A". Since both "B" and "C" are new, there is a third identifier header having a count of 2 and the "B" and "C" following. The next 5 "A"s are a repeated string so there is a fourth identifier header with a count of 5 and a backwards pointer.

It will be appreciated that, although shown separately with different examples, the hashing of 3 bytes subblocks and the hashing of 4 bytes subblocks are performed consecutively within the matching algorithm, where the following relationship is maintained:

$$\text{Hash}\_3 = f(\text{byte}\_1, \text{byte}\_2, \text{byte}\_3)$$

$$\text{Hash}\_4 = f(\text{Hash}\_3, \text{byte}\_4)$$

instead of $$\text{Hash}\_4 = f(\text{byte}\_1, \text{byte}\_2, \text{byte}\_3, \text{byte}\_4)$$

i.e., the 4 byte hash depends on the 3 byte hash, so as to minimize the hash computation.

It will also be appreciated that, although shown with particular integers 3 and 4, the present invention method is not limited to these numbers. Rather, the present invention method maintains the following general relationship:

$$\text{Hash}\_N = f(\text{byte}\_1, \text{byte}\_2, \ldots, \text{byte}\_N)$$

$$\text{Hash}\_{N+1} = f(\text{Hash}\_N, \text{byte}\_{N+1})$$

instead of $$\text{Hash}\_N = f(\text{byte}\_1, \text{byte}\_2, \ldots, \text{byte}\_N, \text{byte}\_{N+1})$$

Another unique feature of the present invention data compression method is the elimination of any dictionary. By eliminating the dictionary, the matching is performed only through the previous data already in memory and therefore the matching is much faster since the computer does not have to search through dictionary tree with leaves and nodes and also does not have to match through a series a strings. Instead, each time a unique subblock of at least 3 characters is encountered, it is initially an incompressible series but is hashed for a future match and thereafter when the same subblock of at least 3 characters is encountered, it is a hash hit and is likely to be encoded with an identifier header setting fourth the number of characters in the hash hit and a backwards pointer. A hash hit only constitutes a possibility for the match length to be met or exceeded.

Figure 5:
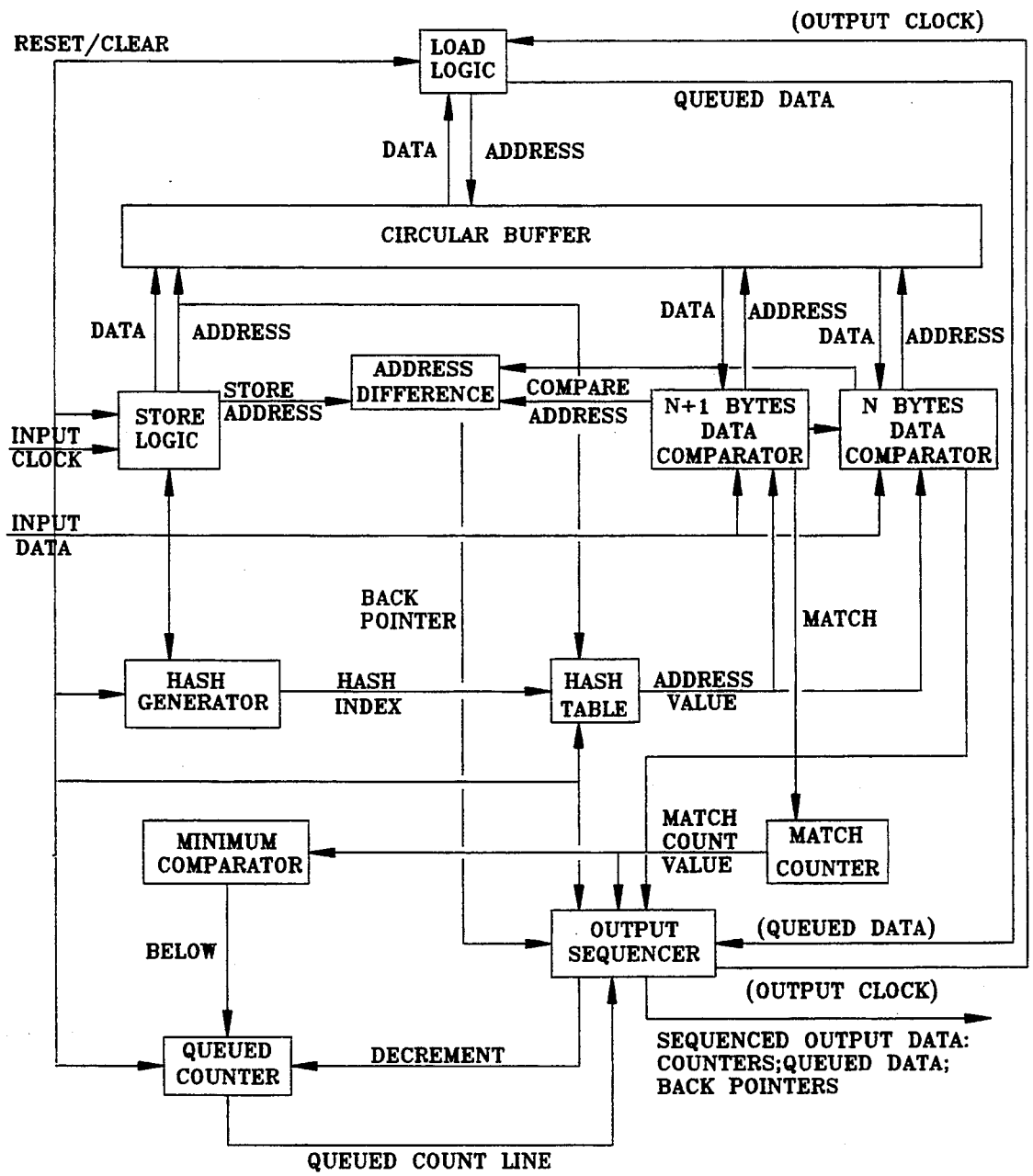
FIG. 5 is a block diagram of a compression apparatus used to perform the present invention data compression method.

An example of the apparatus used to perform the present invention data compression method is illustrated in FIG. 5. The store logic stores all input data into the circular buffer for subsequent reference. After each store, the internal address is incremented. The hash generator remembers the last several bytes (depending on the implementation subblock size). As each input data is received, the oldest byte is discarded, and a new hash index value is generated. The hash table retrieves the address value associated with the hash index, and replaces it with a new address from the store logic. The data comparator only latches the old address value if the result of the previous compare was not equal; otherwise, it increments the previous latched value.

Based on the calculation of N bytes subblocks, the data comparator increments the match counter whenever the compare is equal for N+1 bytes subblocks. If the compare is not equal for N+1 bytes subblocks, the data comparator increments the match counter whenever the compare is equal for N bytes subblocks, and resets the match counter whenever the compare is not equal for N bytes subblocks. The minimum comparator increments the queued counter whenever the match counter value is below the minimum value for generating a back pointer. The output sequencer waits until either the queued counter reaches its maximum value, or until the minimum comparator shows a match counter value not below the minimum.

At that point, the queued count value is output, and the queued data is obtained from the circular buffer through load logic. Then if the minimum comparator shows a match counter value not below the minimum, the output sequencer clocks the load logic (to keep its address in sync), and waits until either the match counter reaches its maximum value, or the data comparator shows no match, and then finally outputs the match counter and the back pointer from the address difference logic.

Defined in detail, the present invention is a matching method useful for digital data compression operations which compresses an input data stream into a compressed output data stream based on a predetermined minimum matching length, where the input data stream comprises a plurality of input data subblocks including subblocks of N bytes and N+1 bytes, and the compressed output data stream comprises a plurality of compressed and uncompressed output data subblocks, the matching method comprising the following steps:

(a) initializing a first hash table and a second hash table each having a plurality of entries;

(b) obtaining a current source pointer for a current input data subblock;

(c) computing an address for said first hash table on an input data subblock of N bytes, where N is an integer;

(d) exchanging said current source pointer with an entry of said first hash table at said address computed in step (c);

(e) saving said entry of said first hash table;

(f) computing an address for said second hash table on an input data subblock of N+1 bytes;

(g) exchanging said current source pointer with an entry of said second hash table at said address computed in step (f);

(h) determining a matching length for said entry of said second hash table obtained in step (g);

(i) if said matching length determined in step (h) is not less than said predetermined minimum matching length, then encoding said current input data subblock as a compressed output data subblock;

(j) if said matching length determined in step (h) is less than said predetermined minimum matching length, then determining a matching length for said entry of said first hash table saved in step (e);

(k) if said matching length determined in step (j) is not less than said predetermined minimum matching length, then encoding said current input data subblock as a compressed output data subblock;

(l) if said matching length determined in step (j) is less than said predetermined minimum matching length, then encoding said current input data subblock as an incompressible output data subblock; and (m) repeating the steps (b) through (l) until all of said plurality of input data subblocks have been processed.

Defined broadly, the present invention is a matching method useful for digital data compression operations which compresses an input data stream into a compressed output data stream, comprising the following steps:

(a) obtaining a current source pointer for a current input data subblock and computing an address for a first hash table on an input data subblock of N bytes, where N is an integer;

(b) exchanging said current source pointer with an entry of said first hash table at said address computed in step (a) and saving said entry of said first hash table;

(c) computing an address for a second hash table on an input data subblock of N+1 bytes;

(d) exchanging said current source pointer with an entry of said second hash table at said address computed in step (c);

(e) determining a matching length for said entry of said second hash table obtained in step (d);

(f) if said matching length determined in step (e) is less than a predetermined minimum matching length, then determining a subsequent matching length for said entry of said first hash table saved in step (b); and (g) encoding said current input data subblock as a compressed output data subblock if said subsequent matching length is greater than or equal to said predetermined minimum matching length.

Defined more broadly, the present invention is a matching method useful for digital data compression operations which compresses an input data stream into a compressed output data stream, where the input data stream comprises a plurality of input data subblocks including subblocks of N bytes and subblocks of N+1 bytes, the matching method comprising the following steps:

(a) hashing on the input data subblocks of N bytes and saving hashing entries, where N is an integer;

(b) hashing on the input data subblocks of N+1 bytes based on said hashing results of the input data subblocks of N bytes computed in step (a) and saving hashing entries;

(c) comparing a current input data subblock with said hashing entries obtained in step (b);

(d) if matching is found then compressing said current input data subblock, and if no matching is found then comparing said current input data subblock with said hashing entries saved in step (a); and (e) compressing said current input data subblock if matching is found during said comparing in step (d).

Defined even more broadly, the present invention is a data compression method for compressing an input data stream into a compressed output data stream, where the input data stream comprises a plurality of input data subblocks including subblocks of N bytes and subblocks of N+1 bytes, the method comprising the following steps:

(a) hashing on the input data subblocks of N bytes, hashing on the input data subblocks of N+1 bytes based on the hashing on the input data subblocks of N bytes, saving respective hashing entries, and comparing a current input data subblock with said hashing entries obtained in hashing the input data subblocks of N+1 bytes;

(b) if no matching is found in step (a) then comparing said current input data subblock with said hashing entries obtained in hashing the input data subblocks of N bytes; and (c) encoding said current input data subblock as incompressible output data subblock if no matching is found in step (b), and encoding said current input data subblock as compressed output data subblock if matching is found in either step (a) or (b).

Defined alternatively in detail, the present invention is an apparatus useful for digital data compression operations which compresses an input data stream into a compressed output data stream based on a predetermined minimum matching length, where the input data stream comprises a plurality of input data subblocks including subblocks of N bytes and N+1 bytes, and the compressed output data stream comprises a plurality of compressed and uncompressed output data subblocks, the apparatus comprising:

(a) means for initializing a first hash table and a second hash table each having a plurality of entries;

(b) means for obtaining a current source pointer for a current input data subblock;

(c) means for computing an address for said first hash table on an input data subblock of N bytes, where N is an integer;

(d) means for exchanging said current source pointer with an entry of said first hash table at said address computed in step (c);

(e) means for saving said entry of said first hash table;

(f) means for computing an address for said second hash table on an input data subblock of N+1 bytes;

(g) means for exchanging said current source pointer with an entry of said second hash table at said address computed in step (f);

(h) means for determining a matching length for said entry of said second hash table obtained in step (g);

(i) means for encoding said current input data subblock as an compressed output data subblock when said matching length determined in step (h) is not less than said predetermined minimum matching length;

(j) means for determining a matching length for said entry of said first hash table saved in step (e) when said matching length determined in step (h) is less than said predetermined minimum matching length;

(k) means for encoding said current input data subblock as a compressed output data subblock when said matching length determined in step (j) is not less than said predetermined minimum matching length;

(l) means for encoding said current input data subblock as an incompressible output data subblock when said matching length determined in step (j) is less than said predetermined minimum matching length; and (m) means for repeating the steps (b) through (l) until all of said plurality of input data subblocks have been processed.

Alternatively defined broadly, the present invention is an apparatus useful for digital data compression operations which compresses an input data stream into a compressed output data stream, where the input data stream comprises a plurality of input data subblocks including subblocks of N bytes and subblocks of N+1 bytes, the apparatus comprising:

(a) means for hashing on the input data subblocks of N bytes and means for saving hashing entries, where N is an integer;

(b) means for hashing on the input data subblocks of N+1 bytes based on said hashing results of the input data subblocks of N bytes computed in step (a) and means for saving hashing entries;

(c) means for comparing a current input data subblock with said hashing entries obtained in step (b);

(d) means for compressing said current input data subblock when matching is found, and means for comparing said current input data subblock with said hashing entries saved in step (a) when no matching is found; and (e) means for compressing said current input data subblock when matching is found during said comparing in step (d).

Alternatively defined more broadly, the present invention is a data compression apparatus for compressing an input data stream into a compressed output data stream, where the input data stream comprises a plurality of input data subblocks including subblocks of N bytes and subblocks of N+1 bytes, the apparatus comprising:

(a) means for hashing on the input data subblocks of N bytes, hashing on the input data subblocks of N+1 bytes based on the hashing on the input data subblocks of N bytes, saving respective hashing entries, and comparing a current input data subblock with said hashing entries obtained in hashing the input data subblocks of N+1 bytes;

(b) means for comparing said current input data subblock with said hashing entries obtained in hashing the input data subblocks of N bytes when no matching is found in step (a); and (c) means for encoding said current input data subblock as incompressible output data subblock if no matching is found in step (b), and means for encoding said current input data subblock as compressed output data subblock if matching is found in either steps (a) or (b).

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus shown is intended only for illustration and for disclosure of an operative embodiment and not to show all of the various forms or modification in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of patent monopoly to be granted.

What is claimed is:

1. A matching method useful for digital data compression operations which compresses an input data stream into a compressed output data stream based on a predetermined minimum matching length, where the input data stream comprises a plurality of input data subblocks including subblocks of N bytes and N+1 bytes, and the compressed output data stream comprises a plurality of compressed and uncompressed output data subblocks, the matching method comprising the following steps:

a. initializing a first hash table and a second hash table each having a plurality of entries;

b. obtaining a current source pointer for a current input data subblock;

c. computing an address for said first hash table on an input data subblock of N bytes, where N is an integer;

d. exchanging said current source pointer with an entry of said first hash table at said address computed in step (c);

e. saving said entry of said first hash table;

f. computing an address for said second hash table on an input data subblock of N+1 bytes;

g. exchanging said current source pointer with an entry of said second hash table at said address computed in step (f);

h. determining a matching length for said entry of said second hash table obtained in step (g);

i. if said matching length determined in step (h) is not less than said predetermined minimum matching length, then encoding said current input data subblock as an compressed output data subblock;

j. if said matching length determined in step (h) is less than said predetermined minimum matching length, then determining a matching length for said entry of said first hash table saved in step (e);

k. if said matching length determined in step (j) is not less than said predetermined minimum matching length, then encoding said current input data subblock as a compressed output data subblock;

l. if said matching length determined in step (j) is less than said predetermined minimum matching length, then encoding said current input data subblock as an incompressible output data subblock; and m. repeating the steps (b) through (l) until all of said plurality of input data subblocks have been processed.

2. The method as defined in claim 1 wherein said integer N is 3.

3. A matching method useful for digital data compression operations which compresses an input data stream into a compressed output data stream, comprising the following steps:

a. obtaining a current source pointer for a current input data subblock and computing an address for a first hash table on an input data subblock of N bytes, where N is an integer;

b. exchanging said current source pointer with an entry of said first hash table at said address computed in step (a) and saving said entry of said first hash table;

c. computing an address for a second hash table on an input data subblock of N+1 bytes;

d. exchanging said current source pointer with an entry of said second hash table at said address computed in step (c);

e. determining a matching length for said entry of said second hash table obtained in step (d);

f. if said matching length determined in step (e) is less than a predetermined minimum matching length, then determining a subsequent matching length for said entry of said first hash table saved in step (b); and g. encoding said current input data subblock as a compressed output data subblock if said subsequent matching length is greater than or equal to said predetermined minimum matching length.

4. The method as defined in claim 3 further comprising the step of initializing said first hash table and said second hash table.

5. The method as defined in claim 3 further comprising the step of encoding said current input data subblock as a compressed output data subblock if said matching length determined in step (e) is greater than or equal to said predetermined minimum matching length.

6. The method as defined in claim 3 further comprising the step of encoding said current input data subblock as an incompressible output data subblock if said subsequent matching length determined in step (f) is less than said predetermined minimum matching length.

7. The method as defined in claim 3 wherein said integer N is 3.

8. A matching method useful for digital data compression operations which compresses an input data stream into a compressed output data stream based on a predetermined minimum matching length, where the input data stream comprises a plurality of input data subblocks including subblocks of 3 bytes and 4 bytes, and the compressed output data stream comprises a plurality of compressed and incompressed output data subblocks, the matching method comprising the following steps:

a. initializing a first hash table and a second hash table each having a plurality of entries and initializing a source pointer;

b. obtaining a current source pointer for a current input data subblock;

c. computing an address for said first hash table on an input data subblock of 3 bytes;

d. exchanging said current source pointer with an entry of said first hash table at said address computed in step (c);

e. saving said entry of said first hash table;

f. computing an address for said second hash table on an input data subblock of 4 bytes;

g. exchanging said current source pointer with an entry of said second hash table at said address computed in step (f);

h. determining a matching length for said entry of said second hash table obtained in step (g);

i. if said matching length determined in step (h) is not less than said predetermined minimum matching length, then encoding said current input data subblock as an compressed output data subblock;

j. if said matching length determined in step (h) is less than said predetermined minimum matching length, then determining a matching length for said entry of said first hash table saved in step (e);

k. if said matching length determined in step (j) is not less than said predetermined minimum matching length, then encoding said current input data subblock as a compressed output data subblock;

l. if said matching length determined in step (j) is less than said predetermined minimum matching length, then encoding said current input data subblock as an incompressible output data subblock; and m. repeating the steps (b) through (l) until all of said plurality of input data subblocks have been processed.

9. The method as defined in claim 8 wherein said predetermined minimum matching length is 3 bytes.

10. A matching method useful for digital data compression operations which compresses an input data stream into a compressed output data stream, where the input data stream comprises a plurality of input data subblocks including subblocks of N bytes and subblocks of N+1 bytes, the matching method comprising the following steps:

a. initializing a first hash table and a second hash table each having a plurality of entries;

b. obtaining a current source pointer for a current input data subblock;

c. hashing on the input data subblocks of N bytes and saving hashing entries, where N is an integer;

d. hashing on the input data subblocks of N+1 bytes based on said hashing results of the input data subblocks of N bytes computed in step (c) and saving hashing entries;

e. exchanging the current source pointer with the contents of a first source pointer at the hash entry of step (c) and a second source pointer at the hash entry of step (d), and saving the respective first and second hash table source pointers;

f. comparing a current input data subblock with data at said first saved source pointer obtained in step (e);

g. if matching is found then compressing said current input data subblock, and if no matching is found then comparing said current input data subblock with data at said second saved source pointer in step (e); and h. compressing said current input data subblock if matching is found during said comparing in step (g).

11. The method as defined in claim 10 further comprising the step of encoding said current input data subblock as incompressible data output subblock if no matching is found during said comparing in steps f and g.

12. The method as defined in claim 10 further comprising the step of repeating the steps (c) through (h) until all of said plurality of input data subblocks have been processed.

13. The method as defined in claim 10 wherein said integer N is 3.

14. An apparatus useful for digital data compression operations which compresses an input data stream into a compressed output data stream based on a predetermined minimum matching length, where the input data stream comprises a plurality of input data subblocks including subblocks of N bytes and N+1 bytes, and the compressed output data stream comprises a plurality of compressed and incompressible output data subblocks, the apparatus comprising:

a. means for initializing a first hash table and a second hash table each having a plurality of entries;

b. means for obtaining a current source pointer for a current input data subblock;

c. means for computing an address for said first hash table on an input data subblock of N bytes, where N is an integer;

d. means for exchanging said current source pointer with an entry of said first hash table at said address computed in step (c);

e. means for saving said entry of said first hash table;

f. means for computing an address for said second hash table on an input data subblock of N+1 bytes;

g. means for exchanging said current source pointer with an entry of said second hash table at said address computed in step (f);

h. means for determining a matching length for said entry of said second hash table obtained in step (g);

i. means for encoding said current input data subblock as an compressed output data subblock when said matching length determined in step (h) is not less than said predetermined minimum matching length;

j. means for determining a matching length for said entry of said first hash table saved in step (e) when said matching length determined in step (h) is less than said predetermined minimum matching length;

k. means for encoding said current input data subblock as a compressed output data subblock when said matching length determined in step (j) is not less than said predetermined minimum matching length;

l. means for encoding said current input data subblock as an incompressible output data subblock when said matching length determined in step (j) is less than said predetermined minimum matching length; and m. means for repeating the steps (b) through (l) until all of said plurality of input data subblocks have been processed.

15. The apparatus as defined in claim 14 wherein said integer N is 3.

16. An apparatus useful for digital data compression operations which compresses an input data stream into a compressed output data stream, where the input data stream comprises a plurality of input data subblocks including subblocks of N bytes and subblocks of N+1 bytes, the apparatus comprising:

a. means for initializing a first hash table and means for initializing a second hash table, each having a plurality of entries;

b. means for obtaining a current source pointer for a current input data subblock;

c. means for hashing on the input data subblocks of N bytes and means for saving hashing entries, where N is an integer;

d. means for hashing on the input data subblocks of N+1 bytes based on said hashing results of the input data subblocks of N bytes computed in step (a) and means for saving hashing entries;

e. means for exchanging the current source pointer with the contents of a first source pointer at the hash entry of (c) and a second source pointer at the hash entry of (d), and means for saving the first and second source pointers;

f. means for comparing a current input data subblock with data at first saved source pointer obtained in (e);

g. means for compressing said current input data subblock when matching is found, and means for comparing said current input data subblock with data at second source pointer saved in step (e) when no matching is found; and h. means for compressing said current input data subblock when matching is found during said comparing in step (g).

17. The apparatus as defined in claim 16 further comprising means for encoding said current input data subblock as incompressible data output subblock when no matching is found during said comparing in steps f and g.

18. The apparatus as defined in claim 17 further comprising means for repeating the operation of steps (c) through (h) until all of said plurality of input data subblocks have been processed.

19. A data compression method for compressing an input data stream into a compressed output data stream, where the input data stream comprises a plurality of input data subblocks including subblocks of N bytes and subblocks of N+1 bytes, the method comprising the following steps:

a. initializing a first hash table and a second hash table each having a plurality of entries;

b. obtaining a current source pointer for a current input data subblock;

c. hashing on the input data subblocks of N bytes, hashing on the input data subblocks of N+1 bytes based on the hashing on the input data subblocks of N bytes, saving respective hashing entries, exchanging the current source pointer with the contents of a source pointer at each of the respective first and second hash tables, saving the hash table source pointers, and comparing a current input data subblock with data at said saved source pointer obtained from hashing the input data subblocks of N+1 bytes;

d. if no matching is found in step (c) then comparing said current input data subblock with data at saved source pointer obtained from hashing the input data subblocks of N bytes; and e. encoding said current input data subblock as incompressible output data subblock if no matching being found in step (d), and encoding said current input data subblock as compressed output data subblock if matching being found in either step (c) or (b) (d).

20. A data compression apparatus for compressing an input data stream into a compressed output data stream, where the input data stream comprises a plurality of input data subblocks including subblocks of N bytes and subblocks of N+1 bytes, the apparatus comprising:

a. means for initializing a first hash table and means for initializing a second hash table, each having a plurality of entries;

b. means for obtaining a current source pointer for a current input data subblock;

c. means for hashing on the input data subblocks of N bytes, hashing on the input data subblocks of N+1 bytes based on the hashing on the input data subblocks of N bytes, saving respective hashing entries, means for exchanging the current source pointer with the contents of a source pointer at each of the respective hash tables, means for saving the hash table source pointers and means for comparing a current input data subblock with data at said saved source pointer obtained from hashing the input data subblocks of N+1 bytes;

d. means for comparing said current input data subblock with data at said saved source pointer obtained from hashing the input data subblocks of N bytes when no matching is found in step (c); and e. means for encoding said current input data subblock as incompressible output data subblock if no matching is found in step (d), and means for encoding said current input data subblock as compressed output data subblock if matching is found in either steps (c) or (d).

* * * * *

UNITED STATES PATENT AND TRADEMARK OFFICE
CERTIFICATE OF CORRECTION

PATENT NO. : 5,406,278

DATED : April 11, 1995

INVENTOR(S) : Graybill et al.

It is certified that error appears in the above-identified patent and that said Letters Patent is hereby corrected as shown below:

On the title page,
item 75, inventors, after "Agoura Hills" delete ";" and insert --, CA-- therefor; after the name "Gibson" delete "Harbor City, both of Calif." and insert --Coupeville, WA-- therefor.

Column 1, lines 61 & 63, delete "Mcintosh" and insert --McIntosh-- therefor.

Column 6, line 53, delete "$(2^7X^8)$" and insert --$(2^7X8)$-- therefor.

Column 12, line 29, after the word "byte" delete period ".".

Signed and Sealed this

Nineteenth Day of September, 1995

Attest:

BRUCE LEHMAN

Attesting Officer      Commissioner of Patents and Trademarks